United States Patent
Aono et al.

(10) Patent No.: US 11,226,355 B2
(45) Date of Patent: Jan. 18, 2022

(54) SHUNT-RESISTANCE TYPE CURRENT DETECTOR

(71) Applicant: Yazaki Corporation, Tokyo (JP)

(72) Inventors: Yuusuke Aono, Shizuoka (JP); Shigeki Totsuka, Shizuoka (JP); Yoshiaki Makino, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 17/012,036

(22) Filed: Sep. 3, 2020

(65) Prior Publication Data

US 2021/0072286 A1    Mar. 11, 2021

(30) Foreign Application Priority Data

Sep. 5, 2019 (JP) .............................. JP2019-161885

(51) Int. Cl.
*G01R 1/20* (2006.01)
*G01R 15/14* (2006.01)
*G01R 19/00* (2006.01)

(52) U.S. Cl.
CPC ........... *G01R 1/203* (2013.01); *G01R 15/146* (2013.01); *G01R 19/0092* (2013.01)

(58) Field of Classification Search
CPC .. G01R 1/203; G01R 15/146; G01R 19/0092; G01R 31/364; G01R 19/00
USPC ....................................................... 324/126
See application file for complete search history.

(56) References Cited

U.S. PATENT DOCUMENTS

| 2014/0125429 | A1* | 5/2014 | Yoshioka | ............... | G01R 1/203 333/172 |
| 2015/0245490 | A1* | 8/2015 | Kondou | ............... | G01R 1/203 174/260 |
| 2017/0125142 | A1 | 5/2017 | Nakamura et al. | | |
| 2018/0172737 | A1* | 6/2018 | Makinson | ............... | G01K 7/08 |
| 2018/0333800 | A1 | 11/2018 | Wakabayashi et al. | | |
| 2019/0131038 | A1 | 5/2019 | Kao et al. | | |

FOREIGN PATENT DOCUMENTS

| DE | 42 36 086 C1 | 12/1993 |
| DE | 10 2015 216 789 A1 | 3/2017 |
| JP | 2005-181056 A | 7/2005 |
| JP | 2008-182078 A | 8/2008 |
| JP | 2010-272712 A | 12/2010 |
| JP | 2017-116461 A | 6/2017 |
| WO | 2018/229820 A1 | 12/2018 |

* cited by examiner

*Primary Examiner* — Tung X Nguyen
*Assistant Examiner* — Robert P Alejnikov, Jr.
(74) *Attorney, Agent, or Firm* — Kenealy Vaidya LLP

(57) ABSTRACT

A shunt-resistance type current detector includes a flat-plate shaped shunt resistor joined between a flat-plate shaped first bus bar and a flat-plate shaped second bus bar. Each of the bus bars includes respective detection conductors connected to a current detector. The shunt resistor and each of the bus bars are joined via weld parts. A gap for mounting the shunt resistor is formed between the first bus bar and the second bus bar, and projected parts are formed each being projected toward the gap from opposing faces opposing to each other in the gap. The shunt resistor comes an contact with each of the projected parts in a top-and-bottom direction.

3 Claims, 5 Drawing Sheets

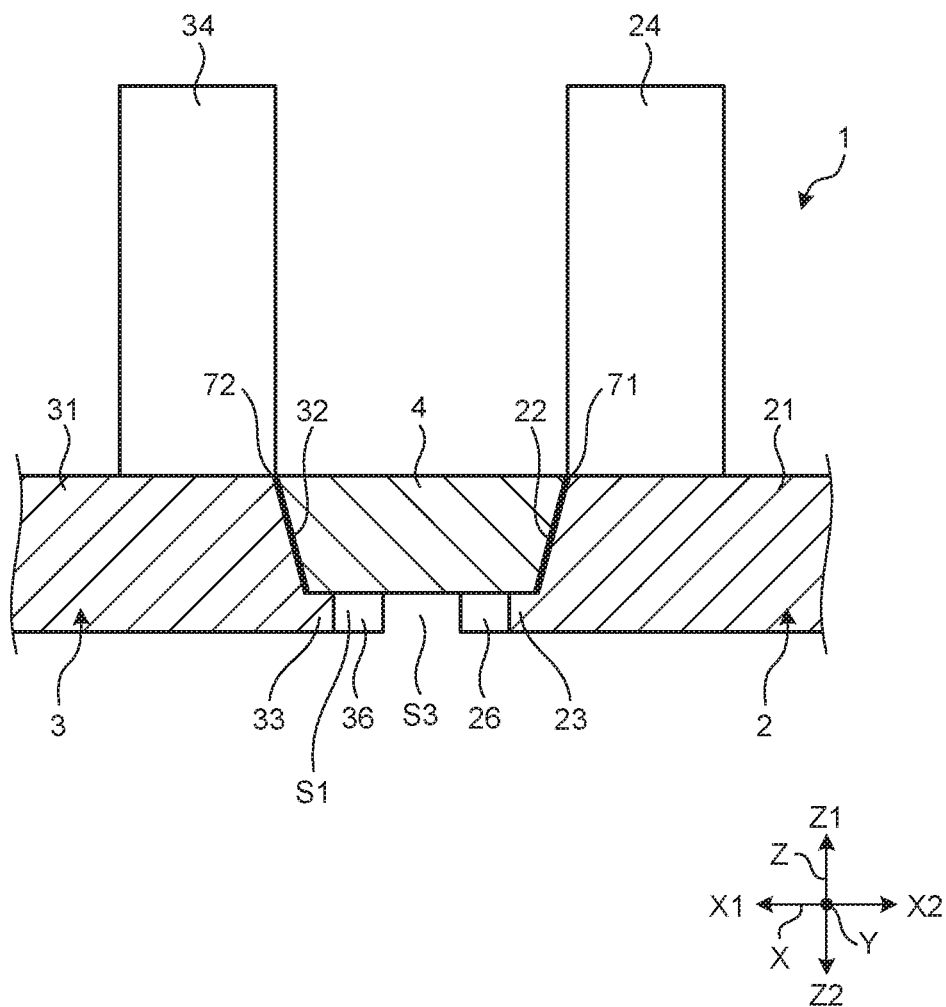

SHUNT-RESISTANCE TYPE CURRENT DETECTOR

CROSS-REFERENCE TO RELATED APPLICATION(S)

The present application claims priority to and incorporates by reference the entire contents of Japanese Patent Application No. 2019-161885 filed in Japan on Sep. 5, 2019.

BACKGROUND OF THE INVENTION

1. Field of the Invention

The present invention relates to a shunt-resistance type current detector.

2. Description of the Related Art

Conventionally, measurement of current values using a shunt resistor is done by detecting a potential difference between the shunt resistor and bus bars provided at both ends by using a current detector. A shunt-resistance type current detector is used for detecting charge/discharge currents of batteries and for detecting currents of motors and the like in hybrid vehicles and electric vehicles.

In a welding method of a shunt resistor and two bus bars according to Japanese Patent Application Laid-open Ho. 2017-116461, disclosed is a technique with which the shunt resistor is abutted and welded to each of the two bus bars in order to provide a weld part interposed between the shunt resistor and the two bus bars, respectively.

However, with Japanese Patent Application Laid-open No. 2017-116461, it is necessary to sandwich the shunt resistor between the two bus bars and perform welding while keeping that state. When sandwiching the shunt resistor between the two bus bars and when performing welding, the positional relation of the shunt resistor with respect to the two bus bars may become different from what is designed. Therefore, in each shunt-resistance type current detector, the welding state of the shunt resistors with respect to the two bus bars may vary. Since the welding state greatly influences the manner of flow of the current flowing in the shunt resistor, the current values under a same condition vary for each of the shunt-resistance type current detectors and the detection accuracy becomes unstable. In order to stabilize the detection accuracy, it is also considered to stabilize the welding state by applying processing such as trimming to the shunt resistors. However, the production cost is increased.

SUMMARY OF THE INVENTION

The present invention is designed in view of the foregoing issue, and proposes a shunt-resistance type current detector capable of stabilizing the positional relation of the shunt resistor with respect to each bus bar at the time of welding with a simple method.

In order to achieve the above mentioned object, a shunt-resistance type current detector according to one aspect of the present invention includes a flat-plate shaped shunt resistor joined between a flat-plate shaped first bus bar and a flat-plate shaped second bus bar, wherein each of the bus bars includes respective detection conductors connected to a current detector, the shunt resistor and each of the bus bars are joined via weld parts, a gap for mounting the shunt resistor is formed between the first bus bar and the second bus bar, and projected parts are formed each projected toward the gap from opposing faces opposing to each other in the gap, and the shunt resistor comes in contact with each of the projected parts in a top-and-bottom direction.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 4 is a fragmentary sectional views of a shunt-resistance type current detector according to a modification example.

DETAILED DESCRIPTION OF THE PREFERRED EMBODIMENT

Hereinafter, an embodiment of a shunt-resistance type current detector 1 according to the present invention will be described in detail by referring to the accompanying drawings. Note, however, that the present invention is not limited to the embodiment illustrated hereinafter. Furthermore, it is to be noted that structural elements in the following embodiment include elements that can be easily replaced by those skilled in the art or elements considered substantially the same. Furthermore, various kinds of omissions, substitutions, and modifications of the structural elements of the following embodiment are possible without departing from the scope of the present invention.

Embodiment

Figure 1:
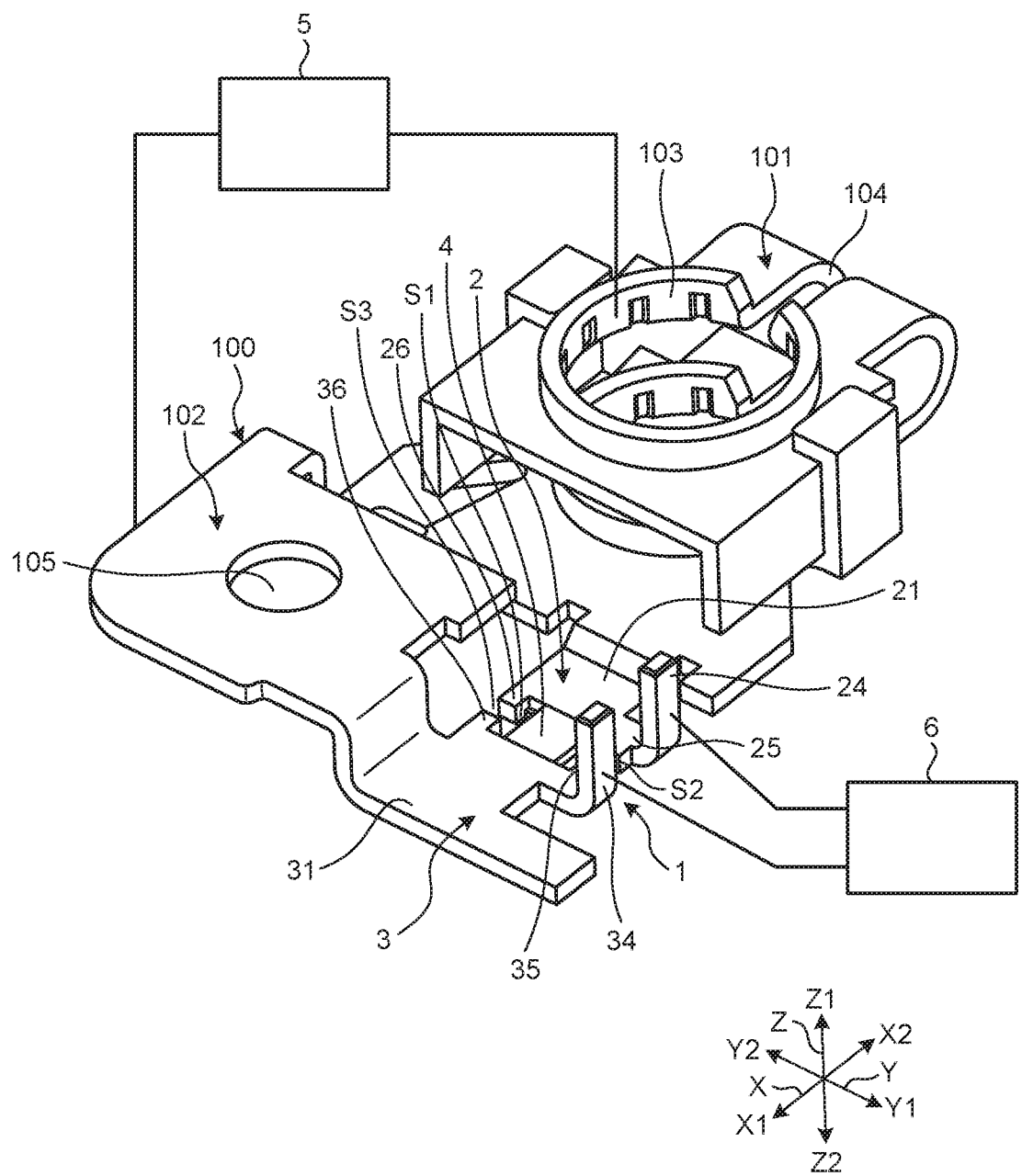
FIG. 1 is a perspective view illustrating a shunt-resistance type current detector according to an embodiment.
Figure 2:
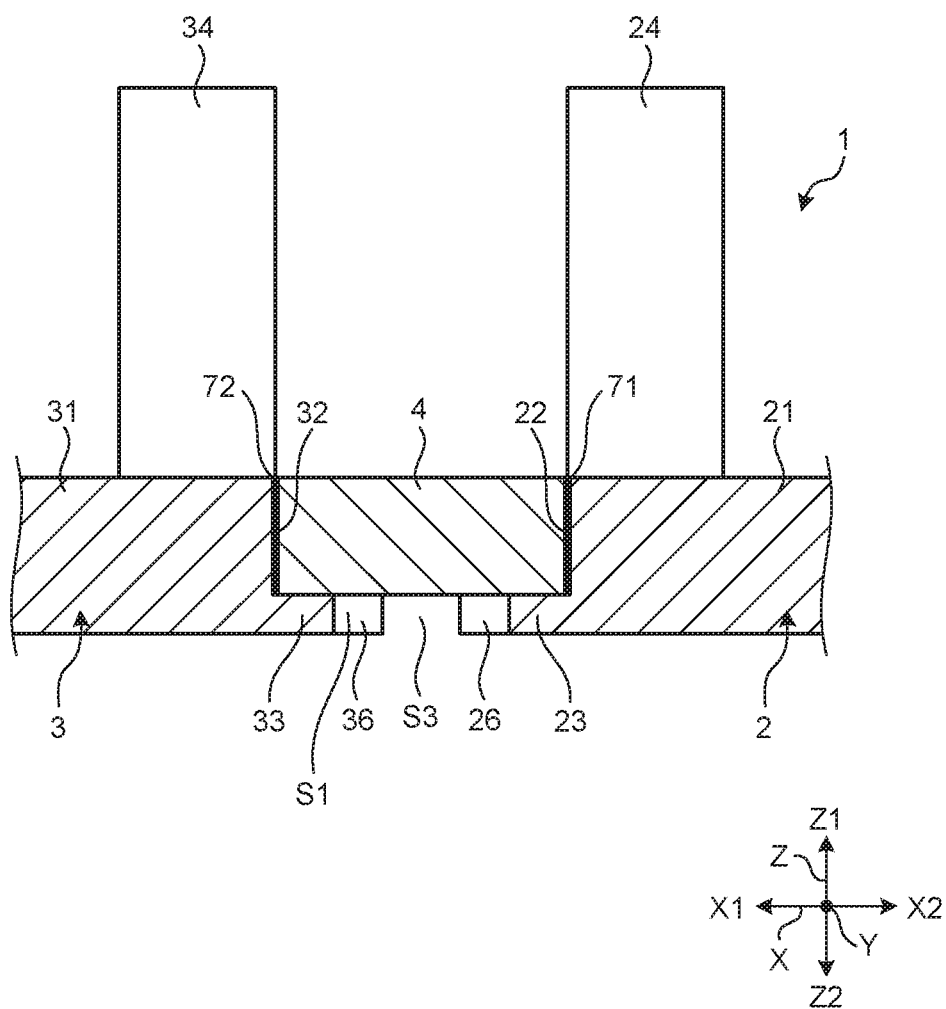
FIG. 2 is a fragmentary sectional view of the shunt-resistance type current detector according to the embodiment.

The shunt-resistance type current detector 1 according to the embodiment will be described by referring to FIG. 1 and FIG. 2. FIG. 1 is a perspective view illustrating the shunt-resistance type current detector according to the embodiment. FIG. 2 is a fragmentary sectional view of the shunt-resistance type current detector according to the embodiment.

In the following description, X-axis direction in the drawings is a front-and-rear direction of the shunt-resistance type current detector 1 of the embodiment, which is the arranged direction of a first bus bar 2, a second bus bar 3, and a shunt resistor 4. Y-axis direction is a direction orthogonal to the X-axis direction, which is the width direction of the shunt-resistance type current detector 1 of the embodiment. Z-axis direction is a direction orthogonal to the X-axis direction and Y-axis direction, which is a top-and-bottom direction of the shunt-resistance type current detector 1 of the embodiment, which is the thickness direction of the first bus bar 2, the second bus bar 3, and the shunt resistor 4, and is a direction parallel to the vertical direction. X1 indicates the front direction, X2 indicates the rear direction, Y1 indicates the near direction, Y2 indicates the far direction, Z1 indicates the upper direction, and Z2 indicates the lower direction.

As illustrated in FIG. 1, the shunt-resistance type current detector 1 configures a part of a fusible link 100, and it is loaded, for example, on a vehicle, not shown. Note here that a battery 5 as a power device and a current detector 6 to be described later are loaded on the vehicle. The shunt-resistance type current detector 1 includes the first bus bar 2, the second bus bar 3, and the shunt resistor 4, and is electrically connected to each of the battery 5 and the current detector 6. The first bus bar 2 and the second bus bar 3 are disposed by being isolated in the front-and-rear direction, and a gap S1 is provided between the first bus bar 2 and the second bus bar 3. As for the first bus bar 2 and the second bus bar 3, the first bus bar 2 is provided on the rear-direction side of the front-and-rear direction, and the second bus bar 3 is disposed on the front-direction side. The shunt resistor 4 is mounted between the first bus bar 2 and the second bus bar 3. In other words, the shunt resistor 4 is set in the gap S1 and electrically connected to the first bus bar 2 and the second bus bar 3 so as to configure the shunt-resistance type current detector 1.

Note here that the fusible link 100 distributes the power from the battery 5 to each device of the vehicle via electric wires, not illustrated. The fusible link 100 includes an annular part 101, a bolt insertion part 102, the first bus bar 2, and the second bus bar 3, and those are formed integrally by press-bending a metal plate exhibiting conductivity.

The annular part 101 has a post insertion hole 103 to which a battery post, not illustrated, of the battery 5 is inserted, and a slit 104 formed continuously with the post insertion hole 103. The post insertion hole 103 is formed in a substantially circular shape, and a tapered part corresponding to a tapered part of the battery post described above is formed in inner circumferential wall faces such that each of the inner circumferential faces come in contact with the battery post when the battery post is being inserted. Note that the annular part 101 is fastened to the battery post by narrowing the width of the slit 104 in a state where the battery post is being inserted to the post insertion hole 103 with a fastening part, not illustrated, configured with a bolt and a nut, for example. The annular part 101 is connected to the first bus bar 2 and the bolt insertion part 102 on the front-direction side.

To the bolt insertion part 102, a stud bolt, not illustrated, is inserted. The bolt insertion part 102 is formed in a flat-plate shape, in which a bolt insertion hole 105 is formed. Note here that the stud bolt exhibiting conductivity is screwed while being inserted into the bolt insertion hole 105 in a state where a metal fitting such as a terminal provided at an end of an electric wire is in contact with a shank exposed from the bolt insertion hole 105, so that the electric wire is electrically connected to the bolt insertion part 102. The bolt insertion part 102 is connected to the annular part 101 on the rear-direction side, and connected to the second bus bar 3 on the near-direction side of the width direction.

The first bus bar 2 is in a flat-plate shape, and formed with a conductive metal such as Cu, for example. The first bus bar 2 includes a main body 21, an opposing face 22, a projected part 23, a detection conductor 24, and a pair of divided parts 25 and 26. The main body 21 is connected to the annular part 101 on the rear-direction side, and connected to the second bus bar 3 via the shunt resistor 4 on the front-direction side. The main body 21 is formed on a plane extended in the front-and-rear direction, and allows the current from the battery 5 flowed from the shunt resistor 4 to flow toward the bolt insertion part 102. The opposing face 22 is a side face opposing to the second bus bar 3 out of the side faces of the main body, that is, the side face on the front-direction side. The opposing face 22 is formed with a plane including the top-and-bottom direction and the width direction. The opposing face 22 configures the gap S1, and opposes to an opposing face 32 to be described later in the front-and-rear direction with the gap S1 interposed therebetween. The projected part 23 is formed to project toward the gap S1 from the opposing face 22, that is, toward the front direction. The projected part 23 of the embodiment is formed by being extended to the pair of divided parts 25 and 26, which are divided in the width direction. The detection conductor 24 is electrically connected to the current detector 6. The detection conductor 24 of the embodiment is projected toward the near-direction side from the side face on the near-direction side out of the side faces of the main body 21, and its top end is formed toward the upper-direction side of the top-and-bottom direction. The detection conductor 24 is formed by bending a bar-shaped part that is extended toward the near-direction side from the side face on the near-direction side out of the side faces of the main body 21. The pair of divided parts 25 and 26 configure the gap S1, each of which is formed by being projected toward the second bus bar 3 with the opposing face 22 interposed therebetween in the width direction.

The second bus bar 3 is in a flat-plate shape, and formed with a conductive metal such as Cu, for example. The second bus bar 3 includes a main body 31, an opposing face 32, a projected part 33, a detection conductor 34, and a pair of divided parts 35 and 36. The main body 31 is connected to the bolt insertion part 102 on the far-direction side, and connected to the first bus bar 2 via the shunt resistor 4 on the rear-direction side. The main body 31 is formed on a plane extended in the front-and-rear direction, and allows the current from the battery 5 flowed from the annular part 101 to flow toward the shunt resistor 4. The opposing face 32 is a side face opposing to the first bus bar 2 out of the side faces of the main body, that is, the side face on the rear-direction side. The opposing face 32 configures the gap S1, and opposes to an opposing face 22 to be described later in the front-and-rear direction with the gap S1 interposed therebetween. The projected part 33 is formed to project toward the gap S1 from the opposing face 32, that is, toward the rear direction. The projected part 33 of the embodiment is formed by being extended to the pair of divided parts 35 and 36, which are divided in the width direction. The detection conductor 34 is electrically connected to the current detector 6. The detection conductor 34 of the embodiment is projected toward the near-direction side from the side face on the near-direction side out of the side faces of the main body 31, and its top end is formed toward the upper-direction side of the top-and-bottom direction. The detection conductor 34 is formed by bending a bar-shaped part extended toward the near-direction side from the side face on the near-direction side out of the side faces of the main body 31. The pair of divided parts 35 and 36 configure the gap S1, each of which is formed by being projected toward the first bus bar 2 with the opposing face 32 interposed therebetween in the width direction. Note here that a gap S2 is formed between the divided part 25 and the divided part 35, and a gap S3 is formed between the divided part 26 and the divided part 36. That is, the first bus bar 2 and the second bus bar 3 are not connected in a state where the shunt resistor 4 is being mounted. Furthermore, the divided part 25 and the divided part 35 as well as the divided part 26 and the divided part 36 are connected to each other in advance to configure a pair of connected parts 201 and 202 (see FIG. 3A) for connecting the first bus bar 2 and the second bus bar 3, which are separated when the shunt resistor 4 is mounted.

The shunt resistor 4 is formed in a flat-plate shape and inserted into the gap S1, and it is in a rectangular shape with the width direction being its longitudinal direction when viewed from the top-and-bottom direction. The shunt resistor 4 of the embodiment is formed with a material different from that of the first bus bar 2 and the second bus bar 3. For example, the shunt resistor 4 is formed with a conductive metal such as a Cu—Mn—Ni based metal, a Cu—Ni based metal, or a Ni—Cr based metal. The shunt resistor 4 is formed such that the length in the front-and-rear direction is the same as or slightly shorter than the length of the gap S1 in the front-and-rear direction and longer than the length between the projected parts 23 and 33 the front-and-rear direction. That is the position of the shunt resistor 4 is aligned with respect to the gap S1 by being placed such that the bottom face in the lower direction comes in contact with each of the projected parts 23 and 33 when inserted into the gap S1. Out of the side faces of the shunt resistor 4, both side faces in the front-and-rear direction oppose to the opposing faces 22 and 32, thereby functioning as connecting faces.

Note here that the shunt resistor 4 is joined with each of the first bus bar 2 and the second bus bar 3 via respective weld parts 71 and 72 such as to be mounted in the gap S1 between the first bus bar 2 and the second bus bar 3. The weld part 71 exists in a boundary between the first bus bar 2 and the shunt resistor 4 in the front-and-rear direction, and it is a junction part formed by melting the first bus bar 2 and the shunt resistor 4. The weld part 72 exists in a boundary between the second bus bar 3 and the shunt resistor 4 in the front-and-rear direction, and it is a junction part formed by melting the second bus bar 3 and the shunt resistor 4. The weld parts 71 and 72 are formed as planes including the top-and-bottom direction and the width direction. While there is no specific limit set for the types of welding to be performed on each of the bus bars 2 and 3, and the shunt resistor 4, it is preferable to employ laser welding, electron beam welding, arc welding, or the like.

Figure 3A:
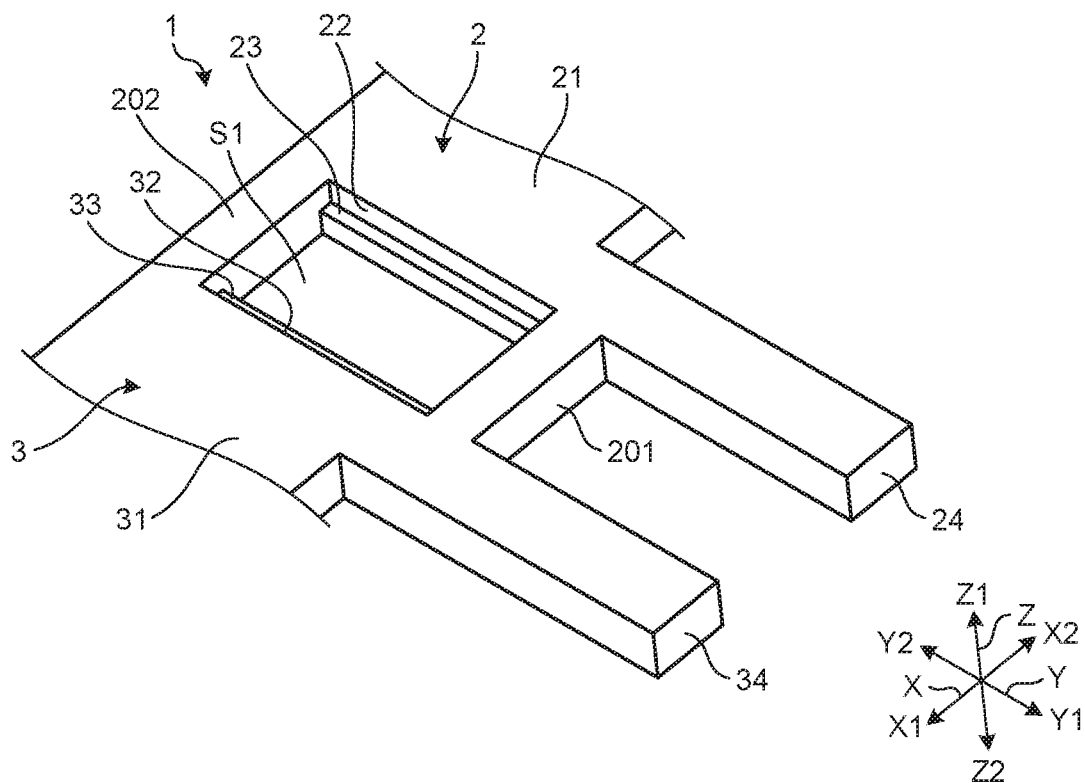
FIG. 3A is a diagram illustrating a mounting method of a shunt resistor.

Next, manufacture of the shunt-resistance type current detector 1 according to the embodiment will be described. FIG. 3A to FIG. 3D are diagrams illustrating a mounting method of the shunt resistor. In a state where the shunt resistor 4 is not mounted in the gap S1, the pair of connected parts 201 and 202 are formed as illustrated in FIG. 3A. Those are for preventing the gap S1 from being deformed by an external force such as welding performed when mounting the shunt resistor 4.

First, an operator inserts the shunt resistor 4 into the gap S1. Here, when the operator inserts the shunt resistor 4 into the gap S1, the shunt resistor 4 comes in contact with the pair of projected parts 23 and 33 to be loaded on the pair of projected parts 23 and 33. Thereby, the shunt resistor 4 and the opposing faces 22 and 32 oppose to each other in the front-and-rear direction, and the position of the shunt resistor 4 with respect to each of the bus bars 2 and 3 in the front-and-rear direction is aligned.

Figure 3B:
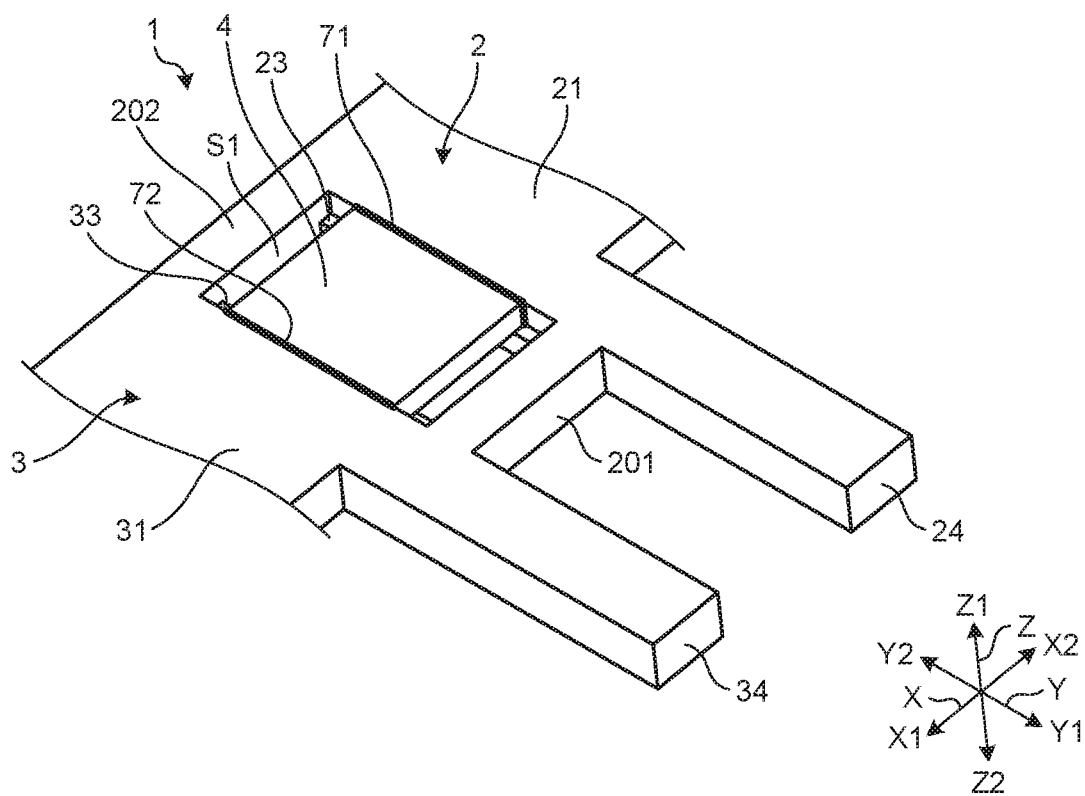
FIG. 3B is a diagram illustrating the mounting method of the shunt resistor.

Then, in a state where the shunt resistor 4 is being inserted in the gap S1, the operator joins the shunt resistor 4 with each of the bus bars 2 and 3 by performing welding for each of those. Here, in a state where the shunt resistor 4 is being loaded on the pair of projected parts 23 and 33, the weld part 71 extended in the top-and-bottom direction and the width direction is formed between the first bus bar 2 and the shunt resistor 4, and the weld part 72 extended in the top-and-bottom direction and the width direction is formed between the second bus bar 3 and the shunt resistor 4 as illustrated in FIG. 3B.

Figure 3C:
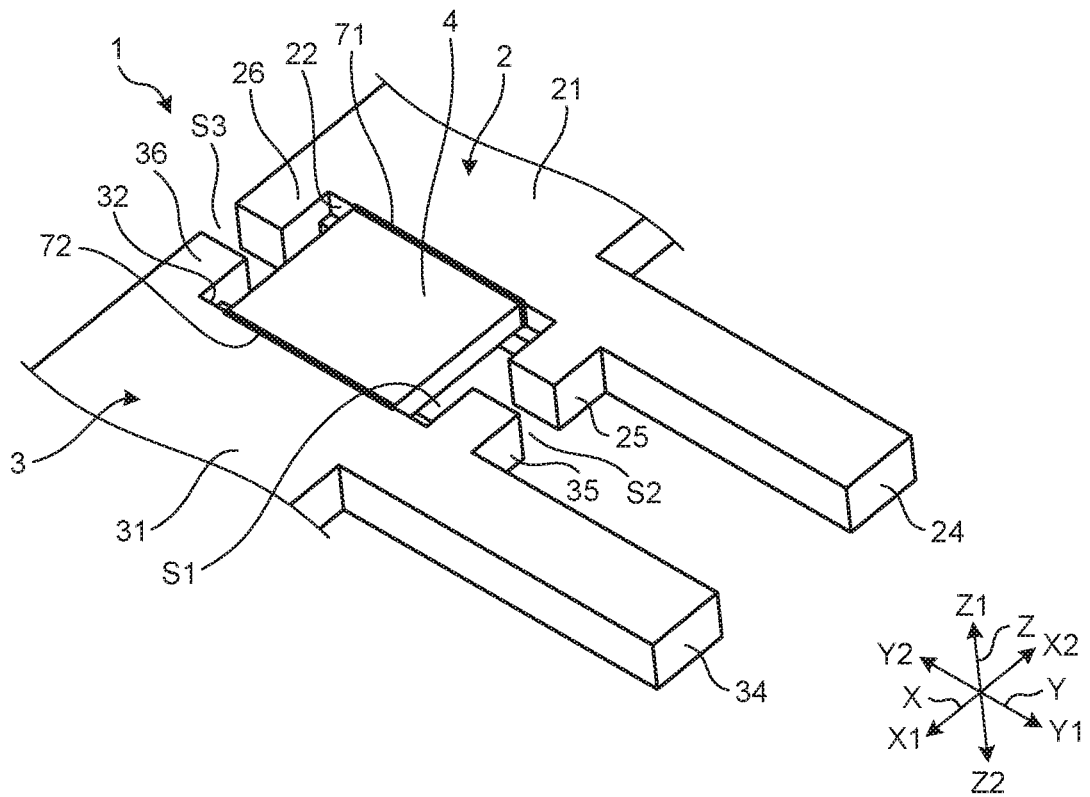
FIG. 3C is a diagram illustrating the mounting method of the shunt resistor.

Then, in a state where the shunt resistor 4 is joined with each of the bus bars 2 and 3, the operator cuts the pair of connected parts 201 and 202 to disconnect the first bus bar 2 and the second bus bar 3. Here, as illustrated in FIG. 3C, a cutting process is performed on the pair of connected parts 201 and 202 to cut each of the pair of connected parts 201 and 202 to form the pair of divided parts 25 and 26 in the first bus bar 2 and to form the pair of divided parts 35 and 36 in the second bus bar 3. That is, the operator forms the gap S2 between the divided parts 25 and 35, and forms the gap S3 between the divided parts 26 and 36.

Figure 3D:
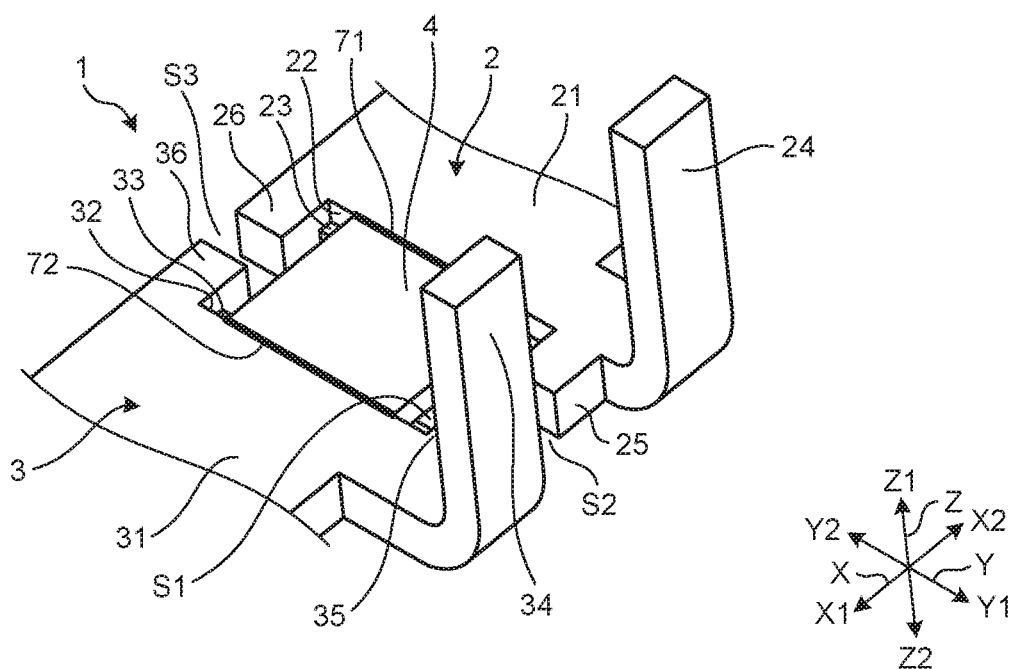
FIG. 3D is a diagram illustrating the mounting method of the shunt resistor.

Then, the operator forms the detection conductors 24 and 34 as a pair. Here, as illustrated in FIG. 3D, a bending process is performed on the pair of detection conductors 24 and 34 to bend the top ends extended in the near-direction side to face upward. Thereby, the shunt-resistance type current detector 1 can be manufactured.

Next, the manner of current flow in the shunt-resistance type current detector 1 according to the embodiment and a current detection method thereof will be described. As illustrated in FIG. 1, the current from the battery 5 flows through the annular part 101 and the bolt insertion part 102 in this order, and also flows through the annular part 101, the first bus bar 2, the shunt resistor 4, the second bus bar 3, and the bolt insertion part 102 in this order. In more detail, the current flows through the annular part 101, the main body 21, the weld part 71, the shunt resistor 4, the weld part 72, the main body 31, and the bolt insertion part 102 in this order. When the current passes through the shunt resistor 4, the current detector 6 detects, as a current value, a potential difference between the detection conductor 24 and the detection conductor 34 formed in the respective bus bars 2 and 3 with the shunt resistor 4 interposed therebetween.

As described above, with the shunt-resistance type current detector 1 according to the embodiment, the shunt resistor 4 can be brought in contact with the pair of projected parts 23 and 33 in advance when joining the shunt resistor 4 with each of the bus bars 2 and 3 by welding. That is, it is possible to prevent the shunt resistor 4 from coming off from the gap S1 and to prevent changes in the relative position thereof with respect to each of the bus bars 2 and 3 and in the gap S1 before the welding work. Therefore, the shunt resistor 4 can be loaded on the projected parts 23 and 33 that are projected toward the gap S1 from the opposing faces 22 and 32 opposing to each other in the gap S1, so that it is possible to stabilize the positional relation of the shunt resistor 4 with respect to each of the bus bars 2 and 3 at the time of welding with a simple method.

While the weld parts 71 and 72 in the shunt-resistance type current detector 1 accord in to the embodiment are formed in parallel to the top-and-bottom direction, the configuration thereof is not limited thereto but may be formed by being tilted with respect to the top-and-bottom direction. FIG. 4 is a fragmentary sectional view of a shunt-resistance type current detector according to a modification example.

In the shunt-resistance type current detector 1 according to the modification example, the weld parts 71 and 72 are formed by being tilted such as to project toward the gap S1 from the upper-direction side toward the lower-direction side along the top-and-bottom direction. In order for the weld parts 71 and 72 to be formed by being tilted along the top-and-bottom direction, both side faces of the opposing faces 22 and 32 and the shunt resistor 4 in the front-and-rear direction are also formed as similar tilted faces. That is, the opposing faces 22 and 32 are tilted faces that are tilted such as to project toward the gap S1 from the upper-direction side toward the lower-direction side. Therefore, from the upper-direction side toward the lower-direction side, the length of the gap S1 in the front-and-rear direction becomes shorter. Furthermore, both side faces of the shunt resistor 4 in the front-and-rear direction, that is, the connecting faces, are tilted faces that are tilted such as to project toward the gap S1 from the upper-direction side toward the lower-direction side. Therefore, from the upper-direction side toward the lower-direction side, the length of the shunt resistor 4 in the front-and-rear direction becomes shorter. As for the opposing faces 22 and 32, the tilted angles with respect to the top-and-bottom direction are the same as the tilted angles of both side faces of the shunt resistor 4 in the front-and-rear direction when viewed from the width direction.

When the operator inserts the shunt resistor 4 into the gap S1, the shunt resistor 4 comes in contact with the pair of projected parts 23 and 33 and also comes in contact with the opposing faces 22 and 32 so that it is possible to maintain the state where the shunt resistor 4 is being in contact with the opposing faces 22 and 32 while being loaded on the pair of projected parts 23 and 33. With this, the shunt resistor 4 opposes to the opposing faces 22 and 32 in the front-and-rear direction and the position of the shunt resistor 4 with respect to each of the bus bars 2 and 3 in the front-and-rear direction is aligned, thereby making it possible to further stabilize the positional relation of the shunt resistor 4 with respect to each of the bus bars 2 and 3 at the time of welding with a simple method.

While the projected parts 23 and 33 are formed in the shunt-resistance type current detector 1 according to the modification example, the projected parts 23 and 33 may not need to be formed. It is because the opposing faces 22 and 32 are tilted faces, so that the opposing faces 22 and 32 come in contact with the shunt resistor 4 when the shunt resistor 4 is inserted into the gap S1, thereby making it possible to prevent the shunt resistor 4 from coming off from the lower-direction side of the gap S1.

In the shunt-resistance type current detector according to the present embodiment, the shunt resistor can be mounted on the projected parts projected toward the gap from the opposing faces that are opposing to each other in the gap. Therefore, it is possible to stabilize the positional relation of the shunt resistor with respect to each of the bus bars at the time of welding with a simple method.

Although the invention has been described with respect to specific embodiments for a complete and clear disclosure, the appended claims are not to be thus limited but are to be construed as embodying all modifications and alternative constructions that may occur to one skilled is the art that fairly fall within the basic teaching herein set forth.

What is claimed is:

1. A shunt-resistance type current detector, comprising:
a flat-plate shaped shunt resistor joined between a flat-plate shaped first bus bar and a flat-plate shaped second bus bar, wherein
each of the bus bars includes respective detection conductors connected to a current detector and an opposing face, the opposing faces oppose each other,
the shunt resistor and each of the bus bars are joined via weld parts,
a gap for mounting the shunt resistor is formed between the opposing face of the first bus bar and the opposing face of the second bus bar, and projected parts are formed each projected into the gap from a respective one of the opposing faces,
the shunt resistor extends into the gap and comes in contact with each of the projected parts in a top-and-bottom direction of the shunt-resistance type current detector, and
the welded parts are at angle of greater than zero degrees with respect to the top-and-bottom direction.

2. The shunt-resistance type current detector according to claim 1,
wherein the shunt resistor has a pair of side walls and a bottom wall that connects to the pair of side walls, each of the pair of side walls abuts a respective one of the opposing faces and the bottom wall abuts both of the projected parts, the detection conductors are spaced away from the opposing faces, and the pair of side walls of the shunt resistor are connected to the opposing faces of the first and the second bus bar via the weld parts.

3. The shunt-resistance type current detector according to claim 1,
wherein the detection conductors are projected toward a near-direction side from a side face on the near-direction side out of side faces of a main body, and top ends of the detection conductors are formed toward an upper-direction side of the top-and-bottom direction.

* * * * *